United States Patent [19]

Baril et al.

[11] Patent Number: 5,006,823
[45] Date of Patent: Apr. 9, 1991

[54] MICROWAVE PHASE SHIFTER WITH 0 OR $\pi$ PHASE SHIFT

[75] Inventors: Michel-Claude Baril, Lesigny; Dominique Rimbert, Paris, both of France

[73] Assignee: Thomson-CSF, Puteaux, France

[21] Appl. No.: 425,815

[22] Filed: Oct. 23, 1989

[30] Foreign Application Priority Data

Oct. 28, 1988 [FR] France .................. 88 14135

[51] Int. Cl.[5] .................. H03H 7/18; H03C 3/00
[52] U.S. Cl. .................. 333/164; 307/262; 307/511; 333/138
[58] Field of Search .............. 333/161, 164, 138, 139; 307/262, 511, 512, 513, 299.1, 571; 328/155, 55

[56] References Cited

U.S. PATENT DOCUMENTS

| 3,590,285 | 6/1971 | Hargrove | 307/262 X |
| 3,626,216 | 12/1971 | Bergman | 307/262 X |
| 4,647,789 | 3/1987 | Upadhyayula | 333/164 X |
| 4,700,153 | 10/1987 | Salvage et al. | 307/262 X |
| 4,857,777 | 8/1989 | Altes | 307/262 X |

FOREIGN PATENT DOCUMENTS 0221632 5/1987 European Pat. Off. .
2719272 11/1977 Fed. Rep. of Germany .
61-257050 11/1986 Japan .

OTHER PUBLICATIONS

Tsai et al., "Switching & Frequency Conversion Using Dual-Gate FETS", 9th European Microwave Conf. Sept., 17-20, 1979, pp. 311-315.

Primary Examiner—Eugene R. LaRoche
Assistant Examiner—Seung Ham
Attorney, Agent, or Firm—Roland Plottel

[57] ABSTRACT

Disclosed is a microwave phase shifter which is capable, in response to a control signal, of generating either a phase shift that is substantially zero or a phase shift that is substantially equal to $\pi$. It comprises a FET that is preferably symmetrical and works in an amplifier assembly. Low-frequency switching-over means make it possible, by reversing the biases at the source and the drain, to invert the FET. This inverting causes a phase shift by $\pi$ in the microwave signal taken at the output of the circuit.

10 Claims, 2 Drawing Sheets

MICROWAVE PHASE SHIFTER WITH 0 OR $\pi$ PHASE SHIFT

BACKGROUND OF THE INVENTION

1. Field of the Invention

The present invention pertains to a microwave phase shifter which is capable, in response to a control signal, of generating a phase shift that is either substantially equal to zero or substantially equal to $\pi$.

2. Description of the Prior Art

The use of $0/\pi$ phase shifters is known, for example in devices for modulation by $0/\pi$ phase encoding or in the quantified electronic phase shifters used for each module of an electronic scanning radar antenna.

Several sorts of devices enabling the making of $0/\pi$ phase shifters, either for a phase modulator or as an elementary bit in an electronic phase shifter for scanning antenna, has been proposed to date. Among these are:

Phase shifters using a PIN diode placed at the end of a normally open transmission line. The PIN diode has the role of short-circuiting this line, in thus creating a phase shift variation equal to $\pi$. This phase shifter necessarily uses a circulator at the end of the line, and a circulator such as this is rather bulky. Furthermore, this type of phase shifter has limited performance characteristics, especially because of the stray capacitance of the diode which has a detrimental effect on its bandwidth.

Phase shifters using two PIN diodes placed at the end of the output arms of a 3 dB hybrid coupler. This hybrid coupler itself is also too bulky, so that this device has the same drawbacks as the previous one.

Interference phase shifters formed by the cascade mounting of cells with low phase shift, using pairs of PIN diodes to load a transmission line. These are devices that are alternately switched over from a type of high-pass filter to a type of low-pass filter, by modification of the state of the diodes. This type of phase shifter may be very bulky if it is desired that it should work in wideband mode, because its bandwidth can be increased only by correlatively increasing the number of cells.

Line switching phase shifters wherein two pairs of PIN diodes placed in T junctions enable the wave to go into either channel of the system, the difference in length between channels being equal to a half wavelength at the working frequency. This type of phase shifter too has the drawback of being bulky and of having a restricted bandwidth.

Inversion phase shifters as described in the document FR—A—2.379.196 wherein a transmission line, of the microstrip type for example, is coupled to a slot line by means of two PIN diodes with opposite states of operation. Depending on the state of the diodes, there follows an excitation of the slot line with phases having a difference intrinsically equal to $\pi$. This device has the drawback of being restricted, in terms of value of the bandwidth, to about 30% of the carrier frequency. Moreover, it practically cannot be made in integrated circuit form and is finally quite bulky.

SUMMARY OF THE INVENTION

The invention seeks to overcome these drawbacks. To this effect, it pertains to a $0/\pi$ phase shifter comprising at least one field effect transistor, to the gate of which the input microwave is applied, the output microwave being taken at the drain or at the source of this transistor. This phase shifter is fitted out with low-frequency switching-over means for the application, between the source and the drain, of a dc bias voltage with a determined value but with a sign differing according to the value of the phase shift (either zero or $\pi$) desired.

Advantageously, the source and the drain of the field effect transistor are each supplied through an electronic switch with low-frequency switching-over transistors which are capable of working under the same dc voltage as the field effect transistor.

BRIEF DESCRIPTION OF THE DRAWINGS

In any case, the invention will be clearly understood and its advantages and features will emerge in the course of the following description of a non-restrictive exemplary embodiment, made with reference to the appended drawings, of which.

DESCRIPTION OF THE PREFERRED EMBODIMENTS

Figure 1:
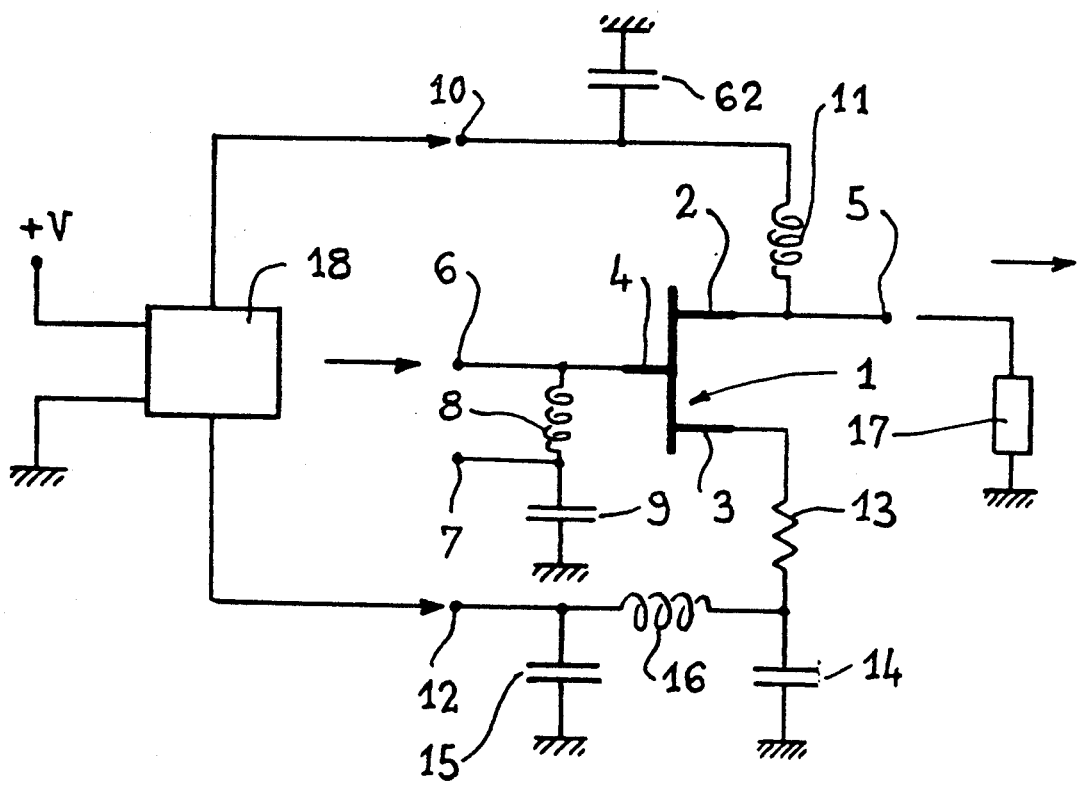
FIG. 1 is a schematic drawing of this $0/\pi$ microwave phase shifter.

In FIG. 1, the reference 1 designates a gallium arsenide field effect transistor (or FET). This FET is advantageously chosen to be of the N type, the mobility of the electrons being greater than that of the holes. Furthermore, it is advantageously chosen to be practically symmetrical. A FET transistor such as this, owing to the symmetry that it shows between its drain and its source, has the property of having its structure turned upside down if voltages applied to these two electrodes are inverted, the electrode 2, which is initially the drain, becoming the source, and the electrode 3, which is initially the source, becoming the drain. It follows that, if the FET 1 is mounted as a microwave amplifier, the signal of one microwave output terminal 5 placed on one of the electrodes, in this case on the electrode 2, changes its sign during the above-mentioned reversal of the biases. This amounts to a phase shift by $\pi$ of the output signal at 5 with respect to the input microwave signal applied at 6 to the gate 4 of the FET 1.

In the very basic circuit of FIG. 1, the negative dc bias of the grid 4 is applied to the terminal 7 through a microwave filter consisting of a choke 8 and a decoupling capacitor 9. The electrode 2 receives its bias at the terminal 10, through another microwave filter consisting of a choke 11 and a decoupling capacitor 62. The electrode 3, for its part, receives its bias at the terminal 12 through the dc bias resistance 13 which is decoupled by a capacitor 14. Just as in the previous case, this bias is applied through a filter consisting of a bias capacitor 15 and a choke 16. Furthermore, the load impedance of the load circuit is shown at 17.

In accordance with the invention, switching-over means, illustrated schematically by a bipolar inverter 18, make it possible, depending on the position of this inverter, either to apply the supply dc voltage $+V$ to the terminal 10 and the ground to the terminal 12, or conversely to apply the ground to the terminal 10 and the dc voltage $+V$ to the terminal 12. Since the FET is symmetrical, this reversal of the biases between source and drain leads to a reversal in the direction of the current in the semiconductor forming the channel of this transistor so that, as explained above, the microwave signal taken at the output 5 is phase-shifted by $\pi$. This circuit therefore gives the $0/\pi$ phase shift without using microwave switching-over elements, but simply dc voltage switching-over means which are low-frequency switching-over means.

Figure 2:
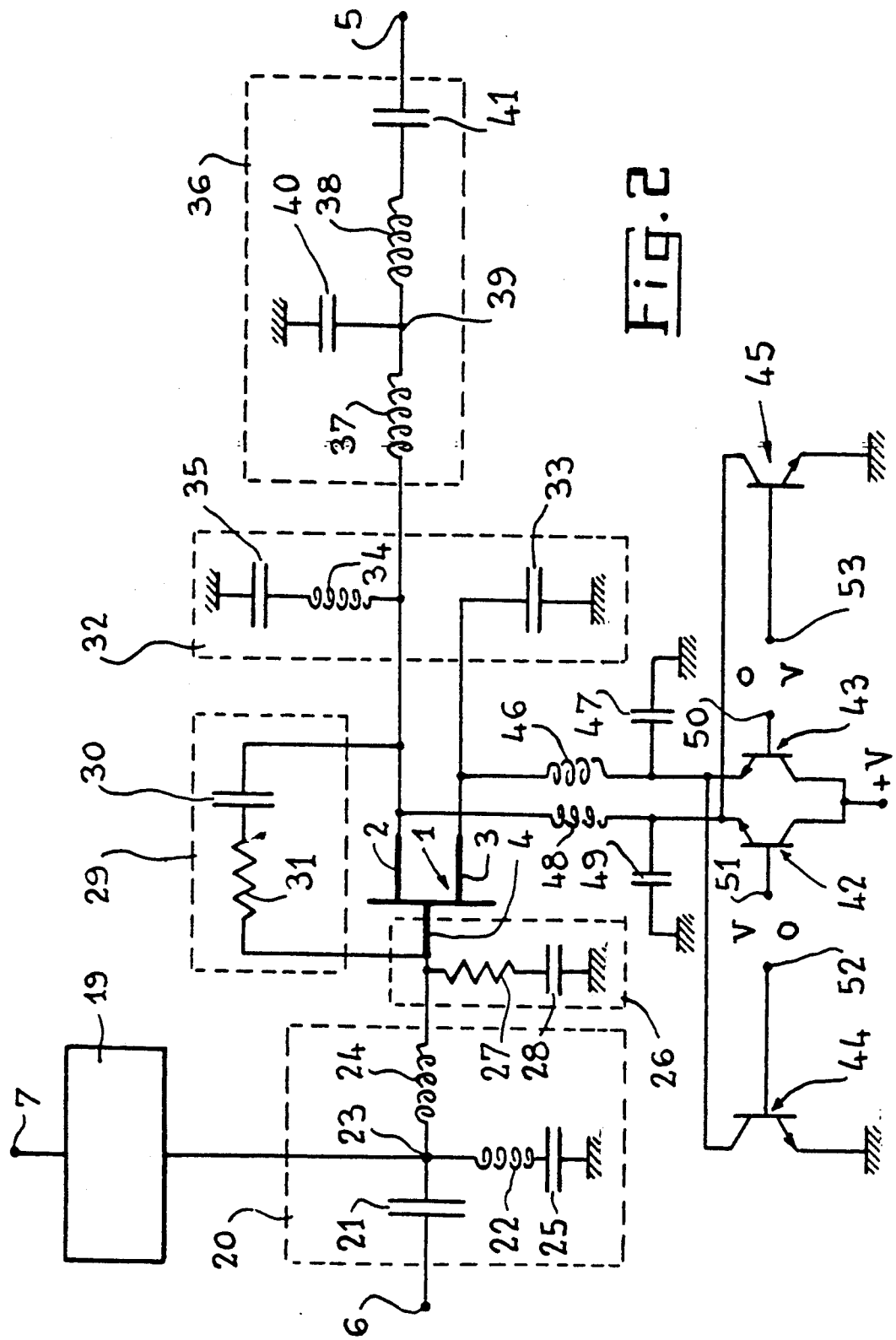
FIG. 2 is a more detailed electrical diagram of this same microwave phase shifter.

A more practical scheme for achieving the basic circuit of FIG. 1 is shown, by way of an example, in FIG. 2.

This diagram shows the FET 1 with its electrode 3, its gate 4 and its other electrode 2.

The gate 4 is supplied in dc bias from the above-mentioned terminal 7, and through a standard gate bias circuit 19 comprising a choke and a decoupling capacitor (not shown).

The microwave signal is applied through the above-mentioned input terminal 7 to the gate 4, through an input matching circuit 20 comprising a connecting capacitor 21, a parallel inductive element 22 connected between the output 23 of the bias circuit 19 and the ground, with a blocking capacitor 25 for the dc current, and a series inductive element 24 connected between the point 23 and the point 4.

Moreover, advantageously, there is provided a parallel amplitude compensation circuit 26 on the gate 4. This circuit 26 consists of a resistor 27 in series with a decoupling capacitor 28. Its purpose is to make the gains or losses of the phase shifter, in both states, close to each other, and to improve the input standing wave ratio (SWR) of the phase shifter.

A series negative feedback circuit 29, comprising a capacitor 30 and a resistor 31 in series, is inserted between the electrode 2 and the gate 4. Its purpose is to stabilize the FET and to make the phase difference between the two states constant in a frequency band of at least one octave in S band, in taking a capacitance of the order of one picofarad. This series negative feedback further enables the gains or losses of the phase shifter to be brought close to each other in both states, and to improve its input standing wave ratio.

Furthermore, there is provision for a phase compensation circuit 32, consisting of a capacitor 33, parallel connected between the electrode 3 and the ground, and a parallel choke 34 with a decoupling capacitor 35 on the electrode 2, as well as an output matching circuit 36. This circuit 36 has two series-mounted chokes 37, 38, the junction point 39 of which is decoupled with respect to the ground by a capacitor 40, and it includes a connecting capacitor 41, the output microwave signal being taken at the above-mentioned terminal 5.

The above-mentioned switching-over means, capable of applying either the $+V$ volts bias to the drain 2 and the 0 volts bias to the source 3 or, conversely, this same $+V$ volts bias to the source 3 and the 0 volts bias to the drain 2, comprise four identical, relatively low-frequency switching-over NPN transistors 42, 43, 44, 45 which bias the electrodes 2 and 3, each by means of a choke and a microwave decoupling capacitor, respectively 46, 47 and 48, 49.

The two transistors 43, 42 each have their collector connected to the dc supply source $+V$ which is, for example, of the order of 5 to 6 volts and is, consequently, as capable of supplying the switching-over transistors 42 to 45 as the FET 1. Their emitters are respectively connected to the electrodes 2 and 3 by means of the above-mentioned microwave filters 46, 47 and 48, 49.

To their respective base electrodes 50, 51, there is applied a 0 volts or $+V$ volts control dc voltage which is provided by standard logic switching-over means that are not shown (consisting, for example, of the two outputs of an astable circuit working as a divider by two), in reverse to each of the respective bases 50, 51: when the 0 volts voltage is applied to the electrode 51, the $+V$ voltage is simultaneously applied to the electrode 50 and vice versa.

The transistor 44 has its emitter connected to the ground while its collector is connected to the emitter of the transistor 43. Its base is supplied at 52 by the same control voltage, 0 volts or V volts, as the base 51 of the transistor 42. Similarly, the transistor 45 has its emitter connected to the ground while its collector is connected to the emitter of the transistor 42 and its base is supplied at 53 by the same control voltage, $+V$ volts or 0 volts, as the base 50 of the transistor 43.

This circuit works as follows:

Let us assume, first of all, that the dc control voltages applied to the terminals 51, 52 on the one hand, and to the terminals 50, 53 on the other hand are respectively equal to $+V$ volts and 0 volts as indicated in FIG. 2. It follows therefrom that the transistors 42 and 44 are saturated while the transistors 43 and 45 are off. The electrode 2 of the FET 1 is practically taken to the voltage $+V$ volts while its source 3 is practically connected to the ground. The microwave signal applied at 6 is thus recovered at 5, normally amplified according to the gain of the transistor 1 which is normally equal to 1. If the control voltages are now inverted, the voltages at the terminals 51, 52 on the one hand and 50, 53 on the other hand are respectively equal to 0 volts and $+V$ volts. Subsequently, the transistors 43 and 45 are saturated while the transistors 42 and 44 are off. This time, it is the electrode 3 that is practically taken to the dc supply voltage, $+V$ volts, while the electrode 2 is practically connected to the ground. As explained above, the FET 1 is inverted so that the output microwave signal appearing at 5 is phase-shifted by $\pi$ with respect to the preceding output signal.

Of course, the above-mentioned phase shift, obtained with the circuit of FIG. 2, is purely theoretical. For, it assumes that the FET used is perfectly symmetrical and it implies that the effects of the stray elements are totally compensated for, which is not always the case depending on the frequency used.

Tests show that, with a FET alone, chosen to be as symmetrical as possible, the difference in phase between the two states is very close to 180 degrees (insertion phase close to zero degrees for the phase shift 0 state and close to 180 degrees for the phase shift $\pi$ state) for relatively low frequencies (below than 1 gigahertz), but that this difference becomes smaller when the frequency becomes higher, and does so all the more quickly as the area of the unit gate of the FET is great. For, the effects of the stray elements of the FET are increased with the frequency and with the area of the unit gate.

The phase compensation circuit 32 advantageously reduces the effects of the stray elements. The circuit of FIG. 2 is simple to implement, using one and the same supply voltage for the FET and the switching-over transistors 43 to 45, and comprising no microwave switching-over element. It enables a phase difference of 180 degrees $\pm 2$ degrees to be obtained on about 30% of the frequency band in S band.

It is also appropriate to point out that, unlike what happens with known phase shifters, with this new type of circuit, the losses may be made null for both states.

For, if the FET is chosen so that this circuit, which is actually an amplifier circuit, has a gain that is strictly equal to 1, it follows that the losses of the phase-shifter are null for each of the two states 0 or $\pi$.

It goes without saying that the invention is not restricted to the exemplary embodiment that has just been described. Other compensation circuits could be added to those with which the device of FIG. 2 is already fitted out. Circuits comprising several FETs, working for example in parallel, could be used. The FET could possibly be not perfectly symmetrical, and could have its circuit adapted accordingly. Instead of being taken at the electrode 2 of the FET, the microwave output could be taken at the electrode 3. Instead of a supply voltage (+V, 0) taken between a single positive terminal and the ground, a supply source (+V, −V) comprising a first positive terminal and a second negative terminal could also be used. The material of which the field effect transistor is made could be other than gallium arsenide, and its doping could be of the P type instead of the N type, etc.

What is claimed is:

1. A microwave phase shifter for generating, in response to a control signal, a phase shift of zero or a phase shift of $\pi$ comprising at least one field effect transistor having three electrodes, one of which is a gate, and to said gate an input microwave is applied, the output microwave being taken at one of the other two electrodes of said transistor, and low-frequency switching-over means for applying, between said other two electrodes, a dc bias voltage with a predetermined value but with a different polarity according to the phase shift (either zero or $\pi$) desired.

2. A microwave phase shifter according to claim 1, wherein said low frequency switching-over means is coupled to the source and drain of said field effect transistor comprise low-frequency switching-over transistors which are connected for working under the same dc voltage as said field effect transistor.

3. A microwave phase shifter according to claim 1, wherein the field effect transistor is chosen to be of the symmetrical type.

4. A microwave phase shifter according to claim 1, wherein the field effect transistor is a gallium arsenide transistor.

5. A microwave phase shifter according to claim 1, wherein the field effect transistor is made of an N type material.

6. A microwave phase shifter according to claim 1, including a phase compensation circuit comprising, on the output electrode of the field effect transistor, a circuit with series-mounted choke and capacitor connected between this electrode and the ground, and a decoupling capacitor on the other electrode of this field effect transistor.

7. A microwave phase shifter according to claim 1, including a negative feedback circuit between the output electrode of the field effect transistor and its gate.

8. A microwave phase shifter according to claim 1, including an amplitude compensation circuit placed in parallel on the gate of the field effect transistor.

9. A microwave phase shifter according to claim 1, wherein said low-frequency switching-over means applies said dc bias voltage between a source electrode and a drain electrode of said transistor.

10. A microwave phase shifter for generating, in response to a control signal, a 0° or 180° phase shift comprising a field effect transistor having three terminals, a gate, a source and a drain; said gate adapted to receive a microwave signal, and the output microwave being provided at one of the other two electrodes of this transistor, low-frequency switching-over means for applying, between the source and the drain, a dc bias voltage with a predetermined value but with a reversible polarity according to the phase shift desired.

* * * * *